US008940615B2

(12) United States Patent
Sun et al.

(10) Patent No.: US 8,940,615 B2
(45) Date of Patent: Jan. 27, 2015

(54) METHOD OF FORMING ISOLATION STRUCTURE

(75) Inventors: Te-Lin Sun, Kaohsiung (TW); Chien-Liang Lin, Taoyuan County (TW); Yu-Ren Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/607,798

(22) Filed: Sep. 9, 2012

(65) Prior Publication Data
US 2014/0073111 A1 Mar. 13, 2014

(51) Int. Cl.
*H01L 21/76* (2006.01)
*H01L 21/31* (2006.01)

(52) U.S. Cl.
USPC ........... 438/429; 438/435; 438/437; 438/775; 438/791

(58) Field of Classification Search
None
See application file for complete search history.

(56) References Cited

U.S. PATENT DOCUMENTS

| | | | | |
|---|---|---|---|---|
| 5,891,789 A * | 4/1999 | Lee | ................................. | 438/439 |
| 6,323,106 B1 * | 11/2001 | Huang et al. | .................. | 438/433 |
| 7,170,109 B2 * | 1/2007 | Sugihara et al. | .............. | 257/192 |
| 7,510,975 B2 * | 3/2009 | Kishimoto et al. | ........... | 438/706 |
| 7,947,551 B1 | 5/2011 | Syue et al. | | |
| 2006/0118917 A1 | 6/2006 | Gong et al. | | |
| 2012/0187523 A1 * | 7/2012 | Cummings et al. | ........... | 257/506 |

* cited by examiner

*Primary Examiner* — Scott B Geyer
(74) *Attorney, Agent, or Firm* — Winston Hsu; Scott Margo

(57) ABSTRACT

The present invention provides a method of forming an isolation structure. A substrate is provided, and a trench is formed in the substrate. Next, a semiconductor layer is formed on a surface of the trench. A nitridation is carried out to form a nitridation layer in the semiconductor layer. Lastly, an insulation layer is filled into the trench.

19 Claims, 5 Drawing Sheets

METHOD OF FORMING ISOLATION STRUCTURE

BACKGROUND OF THE INVENTION

1. Field of the Invention

The present invention relates to a method of forming an isolation structure, and more particularly, to a method of forming an isolation structure having a stress.

2. Description of the Prior Art

In recent years, as various kinds of consumer electronic products have constantly developed towards miniaturization, the size of semiconductor components has reduced accordingly in order to meet requirements of high integration, high performance, low power consumption, and demands for more polyvalent products.

In the present semiconductor process, a localized oxidation isolation (LOCOS) or a shallow trench isolation (STI) are normally used to isolate the MOS transistors. However, with the reduction in both design size and fabricating line width of the semiconductor wafer, the drawbacks of pits, crystal defects and longer bird's beak in the LOCOS process will affect even more the characteristics of the semiconductor wafer. The field oxide produced in the LOCOS process also occupies a larger volume, which affects the integration of the semiconductor wafer. Thus, in the submicron semiconductor process, the STI process is widely used as an isolation technique because of its smaller size and improved integration potential.

The typical fabrication method of a STI is to first form shallow trenches between each MOS device in the surface of the semiconductor wafer, and a dielectric matter is filled into the shallow trenches to obtain an electrical isolation effect. Currently, as the sizes of the semiconductor components shrink and get close to their physical limitations, the shallow trench isolation structures with different sizes and the active regions with different sizes dramatically reversely affect the electrical performances of the components and their processing qualities.

As a result, it is still needed to have an STI which has a better quality and be able to improve the electrical performance of the device encompassed by the STI.

SUMMARY OF THE INVENTION

The present invention therefore provides a method of forming an isolation structure, which can provide a stress thereto improve the electrical performance of the device.

The present invention provides a method of forming an isolation structure. A substrate is provided, and a trench is formed in the substrate. Next, a semiconductor layer is formed on a surface of the trench. A nitridation is carried out to form a nitridation layer in the semiconductor layer. Lastly, an insulation layer is filled into the trench.

The present invention is featured by forming a semiconductor layer in the trench and performing a nitridation process to form the nitridation layer in the semiconductor layer. By adjusting the parameters, the nitridation layer can provide appropriate stress, which can improve the electrical performance of the device encompassed by the isolation structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed. The preferred embodiments of the present invention are illustrated in the accompanying drawings with numbered elements.

Figure 1:
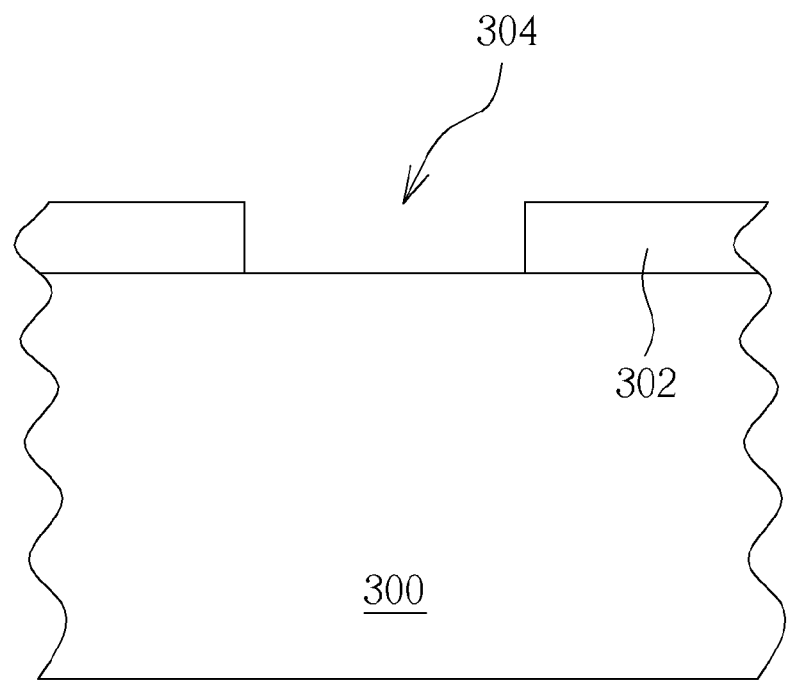
FIG. 1 to FIG. 10 are schematic diagrams of the method of forming an isolation structure according to one embodiment of the present invention.

Please refer to FIG. 1 to FIG. 10, which are schematic diagrams of the method of forming an isolation structure according to one embodiment of the present invention. As shown in FIG. 1, a substrate 300 is provided. The substrate 300 may be a silicon substrate, an epitaxial silicon substrate, a silicon germanium substrate, a silicon carbide substrate or a silicon-on-insulator (SOI) substrate, but is not limited thereto. A patterned mask layer 302 is formed on the substrate 300. The patterned mask layer 302 has at least an opening 304 to expose the substrate 300. In one embodiment, the patterned mask layer 302 includes silicon nitride (SiN), silicon oxynitride (SiON), silicon carbide (SiC), advanced pattern film (APF) supplied by Applied Materials, Inc., their combinations, or their combinations with other materials. In one embodiment, a liner (not shown) such as a $SiO_2$ layer can be optional formed between the substrate 300 and the patterned mask layer 302.

Figure 2:
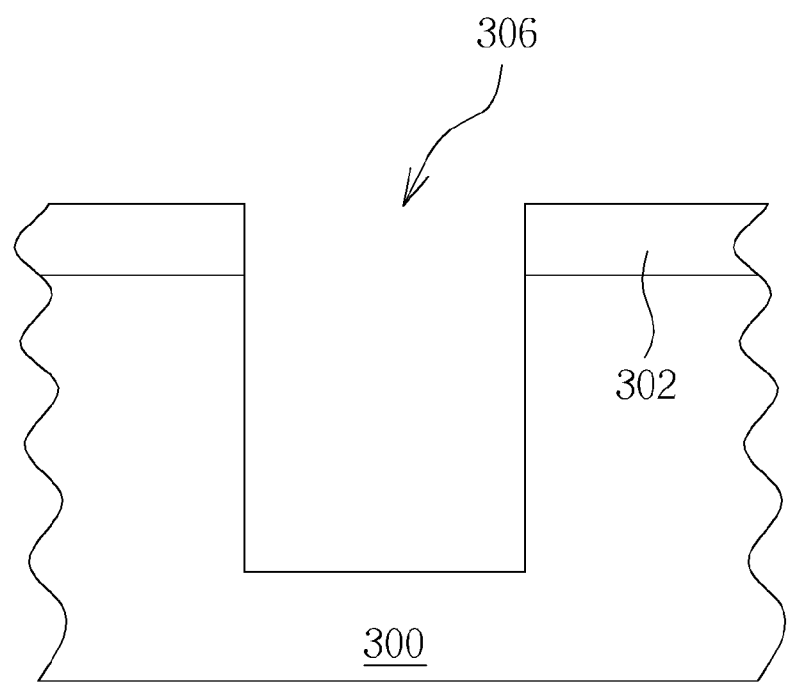

As shown in FIG. 2, a trench 306 is formed in the substrate 300 by using the patterned mask layer 302 as a mask. The step of forming the trench 306 can include an anisotropic etching process, such as a dry etching process. In another embodiment, the trench 306 can be formed by an anisotropic etching process and an isotropic etching process, such as a dry etching process in combination with a wet etching process. The depth of the trench 306 depends on the demands of the products. In one embodiment, when an STI is desired to be formed, the depth of the trench 306 is preferably between 3000 angstroms (Å) to 4000 Å, but is not limited thereto.

Figure 3:
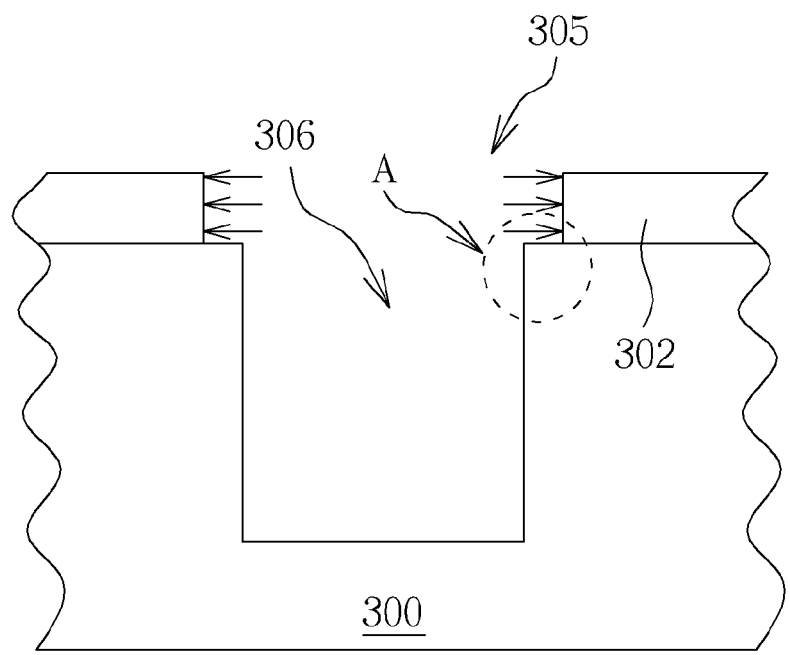

As shown in FIG. 3, depending on different design of the devices, after forming the trench 306, a pull back process can be performed upon the patterned mask layer 302 (and the below liner) to enlarge the opening 304 of the patterned mask layer 302. The enlarged opening 304 therefore becomes the opening 305 and a portion of the substrate 300 is exposed, as shown in region A in FIG. 3.

Figure 4:
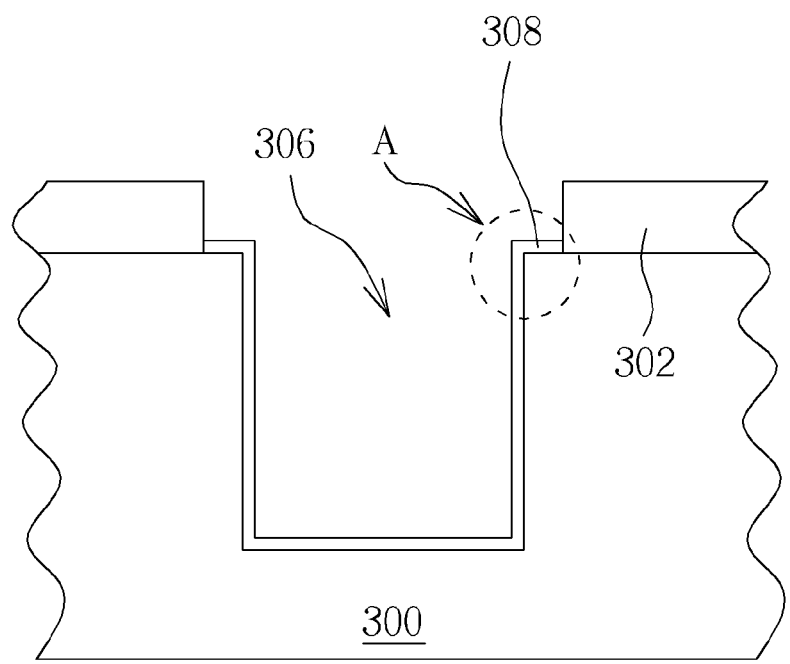
Figure 5:
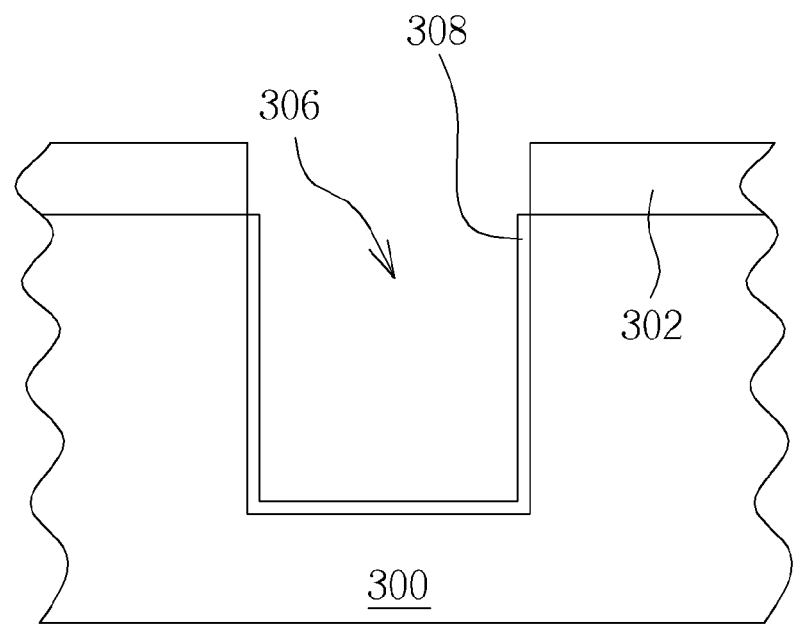

As shown in FIG. 4, a semiconductor layer 308 is formed on the substrate 300. In one embodiment, the semiconductor layer 308 is formed by an epitaxial process, such as a selectively epitaxial growth (SEG) process, so it is preferably formed on exposed substrate 300, that is, the substrate 300 on the surface of the trench 306 and the substrate 300 outside the trench 306 not covered by the patterned mask layer 302. In one embodiment, the semiconductor layer 308 includes, for example, silicon, germanium, carbon, or their combination. The thickness of the semiconductor layer 308 is substantially between 20 Å and 80 Å, preferably 50 Å. In addition, before the epitaxial process, a cleaning process can be carried out to remove the oxide material such as $SiO_2$ on the surface of the substrate 300 in the trench 306 so the quality of the following epitaxial process can be improved. It is worth noting that in another embodiment, as shown in FIG. 5, if the pull back process for the patterned mask layer 302 is not performed, the semiconductor layer 308 is only formed in the trench 306.

Figure 6:
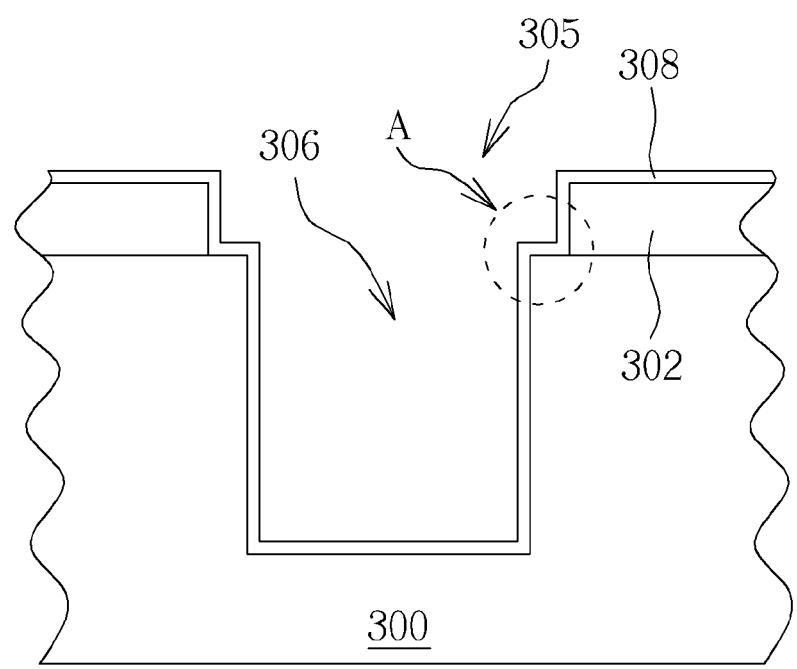
Figure 7:
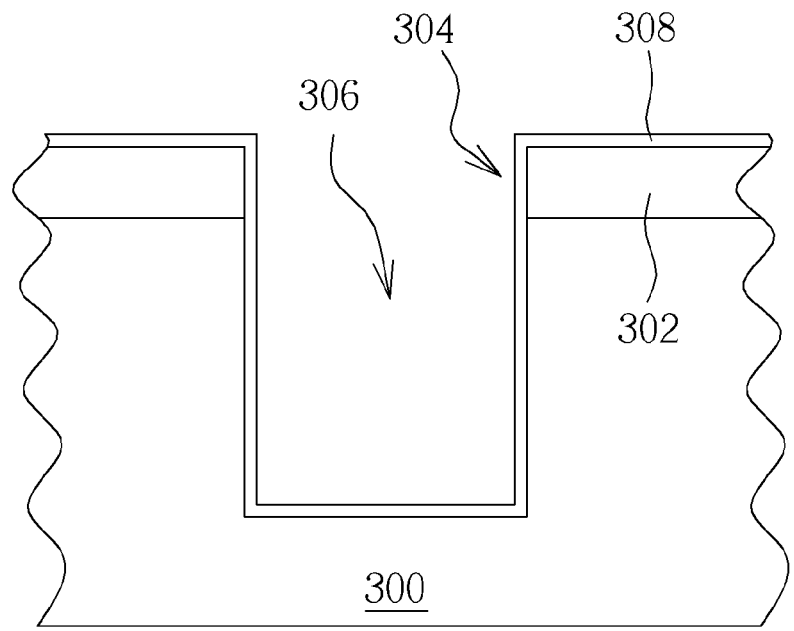
Figure 8:
Figure 8:
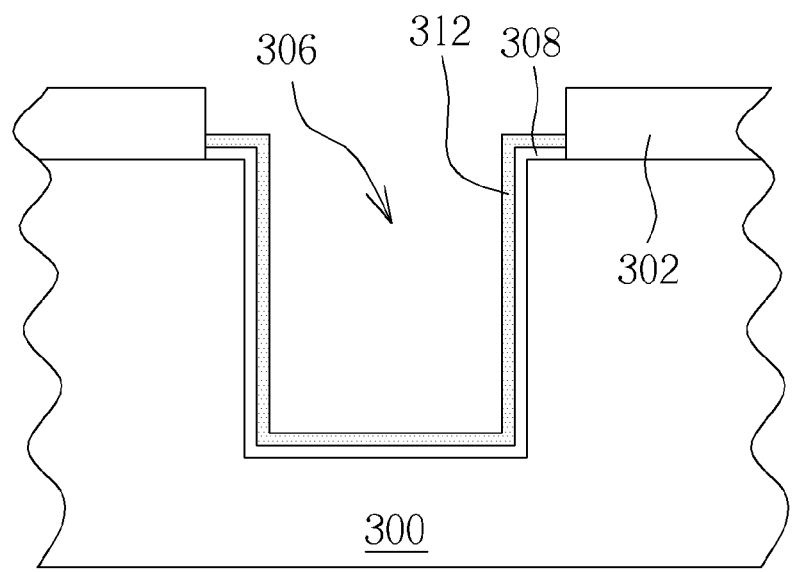

As shown in FIG. 6, in another embodiment, the semiconductor layer 308 can be formed by a deposition process, such as an atomic layer deposition (ALD) process. In this manner, the semiconductor layer 308 is formed conformally along the patterned mask layer 302, the substrate 300 not covered by the patterned mask layer 302 and the substrate 300 on the surface of the trench 308, thereby forming a "step structure" in region A near the opening 305. In this embodiment, the semiconductor layer 308 can be poly-silicon or amorphous-silicon. In another embodiment, as shown in FIG. 7, if the pull back process for the patterned mask layer 302 is not performed, the semiconductor layer 308 will not form the step structure at the position of opening 304.

After forming the semiconductor layer 308 provided by various kinds of embodiments shown above, a nitridation process 310 is then performed upon the semiconductor layer 308. In one embodiment, the portion of the semiconductor layer 308 near the surface will be nitridized to form a nitridation layer 312 while the other part of the semiconductor layer 308 is remained on the substrate 300. In another embodiment, all of the semiconductor layer 308 is nitridized to form the nitridation layer 312. The nitridation process includes any step that can import nitrogen atom into the semiconductor layer 308. In one embodiment, the nitridation process includes a decoupled plasma nitridation (DPN) process and an annealing process. In one embodiment, the DPN process includes supplying nitrogen gas under a room temperature for 10 to 60 seconds, and the subsequent annealing process keeps supplying the nitrogen gas and is performed under a temperature between 800 Celsius degrees and 1100 Celsius degrees. After the nitridation process, the nitridation layer 312 can exhibit a stress, such as a tensile stress or a compressive stress. In one embodiment, when the semiconductor layer 308 includes silicon, the nitridation layer 312 can provide a tensile stress.

Figure 9:
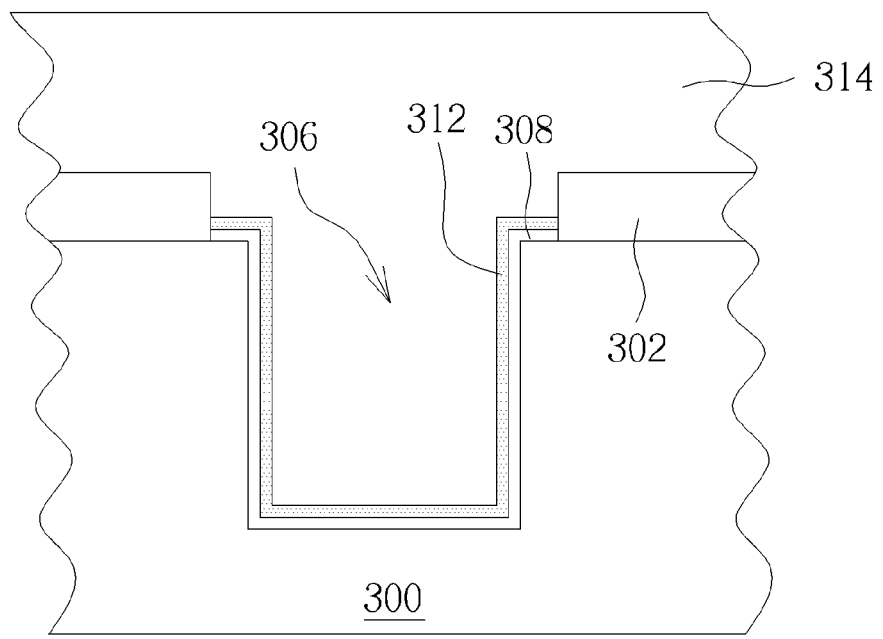

As shown in FIG. 9, an insulation layer 314, such as a $SiO_2$ layer, is formed on the substrate 300 to completely fill the trench 308. In one embodiment, the step of forming the insulation layer 314 may be a chemical vapor deposition (CVD) process for example. The insulation layer 314 can include be a single-layered structure or a multi-layered structure. After forming the insulation layer 314, a densification process can be optionally performed. For example, the insulation layer 314 is subjected to a high temperature environment above 1000 Celsius degrees so the insulation layer 314 in the trench 306 can be more densified.

Figure 10:
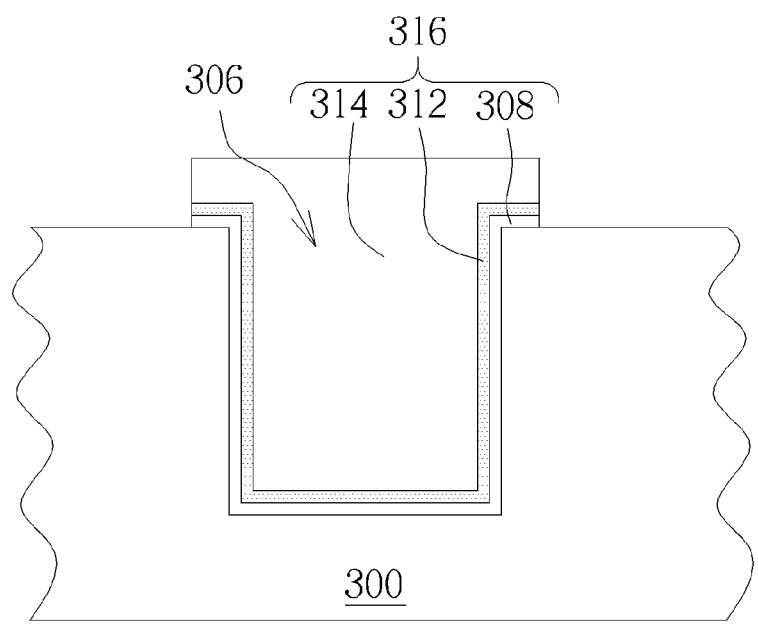

As shown in FIG. 10, a planarization process, such as one or a plurality of chemical mechanical process (CMP) processes, one or a plurality of etching processes, or their combination, can be performed to polish the insulation layer 314 until exposing the patterned mask layer 302. Thereafter, the insulation layer 314, the nitridation layer 312 and the semiconductor layer 308 form an isolation structure 316.

The isolation structure 316 in the present invention can serve as an STI. Due to the stress provided by the nitridation layer 312, the isolation structure 316 can incorporate with other devices with stress to form a selective strain scheme (SSS). For example, when the semiconductor layer 308 includes silicon, the nitridation layer 312 can provide a tensile stress, which can improve the electrical performance of the NMOS that is encompassed by the isolation structure 316.

In addition, comparing to the method of forming an STI in conventional arts, which generally forms an oxide liner by an oxidation process on the surface of the trench and thus consumes the substrate and affects the performance of the devices, the present invention additionally forms a semiconductor layer 308 on the surface of the trench 306 to serve as a sacrifice layer, and then nitridizes the semiconductor layer 308 to provide appropriate stress. Consequently, the semiconductor material in the substrate 300 is not consumed. Moreover, before forming the semiconductor layer 308, a cleaning step is preferably carried out to remove the oxide compound on the substrate 300. Accordingly, in one preferred embodiment, there is no oxide layer between the semiconductor layer 308 and the substrate 300 in the isolation structure 316. In the present invention, the oxide liner structure in conventional arts is totally replaced by the nitridation layer 312 (or the nitridation layer 312 and the semiconductor layer 308), which is able to provide stress. In addition, with regarding to the embodiments shown in FIG. 4 and FIG. 6 in which the pull back process of the patterned mask layer 302 is performed, the semiconductor layer 308 and the nitridation layer 312 will extend to the substrate 300 outside the trench 306 and the stress thereof can be upgraded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an isolation structure, comprising:
   providing a substrate;
   forming a trench in the substrate;
   performing a cleaning process to remove an oxide compound on a surface of the trench;
   after the cleaning process, forming a semiconductor layer on the surface of the trench;
   performing a nitridation process upon the semiconductor layer to form a nitridation layer in the semiconductor layer; and
   filling the trench with an insulation layer.

2. The method of forming the isolation structure as in claim 1, wherein the semiconductor layer comprises Si, Ge or C.

3. The method of forming the isolation structure as in claim 1, wherein the step of forming the semiconductor layer comprises an epitaxial process.

4. The method of forming the isolation structure as in claim 1, wherein the step of forming the semiconductor layer comprises a deposition process.

5. The method of forming the isolation structure as in claim 1, wherein the step of forming the trench comprises:
   forming a patterned mask layer on the substrate; and
   forming the trench in the substrate by using the patterned mask layer as a mask.

6. The method of forming the isolation structure as in claim 5, wherein the semiconductor layer is formed only on the surface of the trench.

7. The method of forming the isolation structure as in claim 5, wherein the semiconductor layer is formed on the surface of the trench and the patterned mask layer.

8. The method of forming the isolation structure as in claim 5, wherein before forming the semiconductor layer, further comprises performing a pull back process for the patterned mask layer.

9. The method of forming the isolation structure as in claim 8, wherein the semiconductor layer is formed on the surface of the trench and the substrate outside the trench not covered by the patterned mask layer.

10. The method of forming the isolation structure as in claim 8, wherein the semiconductor layer is formed on the patterned mask layer, the surface of the trench and the substrate outside the trench not covered by the patterned mask layer.

11. The method of forming the isolation structure as in claim 1, wherein a thickness of the semiconductor layer is between 20 angstroms and 80 angstroms.

12. The method of forming the isolation structure as in claim 1, wherein the nitridation process comprises a decoupled plasma nitrogen (DPN) process and an annealing process.

13. The method of forming the isolation structure as in claim 12, wherein the DPN process is carried out for 10 to 60 seconds at a room temperature.

14. The method of forming the isolation structure as in claim 12, wherein the annealing process is performed by using $N_2$ gas under 800° C. to 1100° C.

15. The method of forming the isolation structure as in claim 1, wherein after the nitridation process, only a portion of the semiconductor layer becomes the nitridation layer while the other portion of the semiconductor layer adjacent to the substrate is remained.

16. The method of forming the isolation structure as in claim 1, wherein after the nitridation process, all the semiconductor layer becomes the nitridation layer.

17. The method of forming the isolation structure as in claim 1, wherein the nitridation layer has a stress.

18. The method of forming the isolation structure as in claim 17, wherein the stress is a tensile stress.

19. The method of forming the isolation structure as in claim 17, wherein the isolation structure is a shallow trench isolation which encompasses an NMOS.

* * * * *